United States Patent
Wang et al.

(10) Patent No.: US 9,711,540 B2
(45) Date of Patent: Jul. 18, 2017

(54) LTPS ARRAY SUBSTRATE

(71) Applicant: Shenzhen China Star Optoelectronics Technology Co., Ltd., Shenzhen, Guangdong (CN)

(72) Inventors: Cong Wang, Guangdong (CN); Peng Du, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 34 days.

(21) Appl. No.: 14/420,901

(22) PCT Filed: Jan. 13, 2015

(86) PCT No.: PCT/CN2015/070629
§ 371 (c)(1),
(2) Date: Feb. 10, 2015

(87) PCT Pub. No.: WO2016/090725
PCT Pub. Date: Jun. 16, 2016

(65) Prior Publication Data
US 2016/0172387 A1     Jun. 16, 2016

(30) Foreign Application Priority Data
Dec. 11, 2014 (CN) .......................... 2014 1 0764302

(51) Int. Cl.
*H01L 27/12* (2006.01)
*H01L 29/417* (2006.01)
*H01L 29/786* (2006.01)

(52) U.S. Cl.
CPC ...... *H01L 27/1255* (2013.01); *H01L 27/1222* (2013.01); *H01L 27/1237* (2013.01); *H01L 29/41733* (2013.01); *H01L 29/78618* (2013.01); *H01L 29/78633* (2013.01); *H01L 29/78675* (2013.01)

(58) Field of Classification Search
None
See application file for complete search history.

(56) References Cited

U.S. PATENT DOCUMENTS

2007/0254415 A1* 11/2007 Oh ...................... H01L 27/1255
                                                                    438/149
2016/0124280 A1* 5/2016 Park .................. G02F 1/136286
                                                                    349/43

* cited by examiner

*Primary Examiner* — Robert Carpenter
(74) *Attorney, Agent, or Firm* — Andrew C. Cheng

(57) ABSTRACT

An LTPS array substrate includes a plurality of LTPS thin-film transistors and a bottom transparent conductive layer, a protective layer, and a top transparent conductive layer. Each LTPS thin-film transistor includes a substrate, a patternized light shield layer, a buffering layer, a patternized poly-silicon layer, a gate insulation layer, a gate electrode line and a common electrode line, an insulation layer, a drain electrode and a source electrode, and a planarization layer that are formed to sequentially stack on each other. The light shield layer covers the scan line and the source/drain. The bottom transparent conductive layer, the protection layer, and the top transparent conductive layer are sequentially stacked on the planarization layer. The patternized poly-silicon layer includes a first portion and a second portion. The drain electrode includes an extension section extending therefrom and opposite to the second portion.

8 Claims, 2 Drawing Sheets

LTPS ARRAY SUBSTRATE

CROSS REFERENCE TO RELATED APPLICATIONS

This application claims the priority of Chinese Patent Application No. 201410764302.6, entitled "LTPS Array Substrate", filed on Dec. 11, 2014, the disclosure of which is incorporated herein by reference in its entirety.

BACKGROUND OF THE INVENTION

1. Field of the Invention

The present invention relates to the technical field of display screens, and in particular to a low temperature poly-silicon (LTPS) array substrate.

2. The Related Arts

An LTPS (Low Temperature Poly-Silicon) thin-film transistor liquid crystal display is different from a traditional amorphous silicon thin-film transistor liquid crystal display by having electron mobility higher than 200 cm2V-sec to effectively reduce the surface area of a thin-film transistor device so as to achieve an increase of aperture ratio and also to reduce the overall power consumption while increasing the brightness of the display. Further, the relatively high electron mobility allows integration of a portion of a driving circuit on a glass substrate, reducing driving IC (Integrated Circuit) and also greatly improving the reliability of a liquid crystal display panel so as to greatly lower down the manufacturing cost of the panel. Thus, the LTPS thin-film transistor liquid crystal display is becoming a hot spot of researches. An LTPS thin-film transistor liquid crystal display generally comprises an array substrate and a color filter substrate opposite to each other.

A conventional LTPS array substrate comprises a bottom common electrode and a pixel electrode that are separated from each other by an insulation layer to constitute a capacitor that serves as a storage capacitor for a pixel corresponding thereto. However, the storage capacitor so structured is relatively small and does not suit the need of capacitance for electrically saturated array substrate.

SUMMARY OF THE INVENTION

The present invention provides an LTPS array substrate, which increases storage capacitance in a condition of not reducing aperture ratio.

The present invention provides an LTPS array substrate, which comprises a plurality of LTPS thin-film transistors. Each of the LTPS thin-film transistors comprises a substrate;
a patterned light shield layer formed on the substrate;
a buffering layer formed on the substrate and the patterned light shield layer;
a patterned poly-silicon layer formed on the buffering layer, wherein the patterned poly-silicon layer comprises a first portion having an orthogonal projection cast on the light shield layer and a second portion extending in a direction away from the light shield layer;
a gate insulation layer formed on the patterned poly-silicon layer and the buffering layer;
a first metal layer formed on the gate insulation layer, the first metal layer being patterned to form a gate electrode line and a common electrode line, the common electrode line, the second portion of the poly-silicon layer that corresponds to the common electrode line, and the gate insulation layer interposed between the common electrode line and the second portion collectively forming a first storage capacitor;
an insulation layer formed on the gate insulation layer and the gate electrode line and the common electrode line;
a second metal layer formed on the insulation layer, the second metal layer being patterned to form a drain electrode and a source electrode, the drain electrode comprising an extension section extending therefrom, the extension section having an orthogonal projection cast on the common electrode line, the extension section of the drain electrode and the common electrode line and the insulation layer between the extension section and the common electrode line collectively forming a second storage capacitor, the second storage capacitor being arranged in parallel with the first storage capacitor; and
a planarization layer formed on the insulation layer and the patterned second metal layer.

In the above LTPS array substrate, the LTPS array substrate further comprises a patterned bottom transparent conductive layer formed on the planarization layer, the bottom transparent conductive layer and the extension section of the drain electrode and the planarization layer between the extension section and the bottom transparent conductive layer collectively forming a third storage capacitor, the third storage capacitor being arranged in parallel with the second storage capacitor and the first storage capacitor.

In the above LTPS array substrate, the LTPS array substrate further comprises a protection layer formed on the patterned bottom transparent conductive layer and a top transparent conductive layer formed on the protection layer, the top transparent conductive layer and the bottom transparent conductive layer and the protection layer between the top transparent conductive layer and the bottom transparent conductive layer collectively forming a fourth storage capacitor, the fourth storage capacitor being arranged in parallel with the third storage capacitor, the second storage capacitor, and the first storage capacitor.

In the above LTPS array substrate, the second metal layer is formed on the insulation layer and is electrically connected through a via to the poly-silicon layer.

In the above LTPS array substrate, the top transparent conductive layer is formed on the protective layer and is electrically connected through a via to the drain electrode.

In the above LTPS array substrate, the planarization layer has a portion that is located above the extension section of the drain electrode and has a thickness that is smaller than that of another portion of the planarization layer.

In the above LTPS array substrate, the gate insulation layer is made of one of silicon oxide, silicon nitride, and silicon oxynitride.

In the above LTPS array substrate, the first metal layer and the second metal layer comprise materials that are electrically conductive materials of molybdenum/aluminum alloys and chromium metal.

In the above LTPS array substrate, the planarization layer comprises a material of an organic film.

In the above LTPS array substrate, the planarization layer is formed through masking operations.

The present invention provides an LTPS array substrate that comprises a patterned poly-silicon layer that comprises an additional second portion and a drain electrode that comprises an extension section formed above the second portion so as to form four parallel storage capacitors, whereby the storage capacitance is increased without reducing aperture ratio.

BRIEF DESCRIPTION OF THE DRAWINGS

To more clearly explain the technical solutions proposed in embodiments of the present invention or those of the prior art, a brief description of the drawings that are necessary for describing the embodiments of the present invention or those of the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to technical solutions of the embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
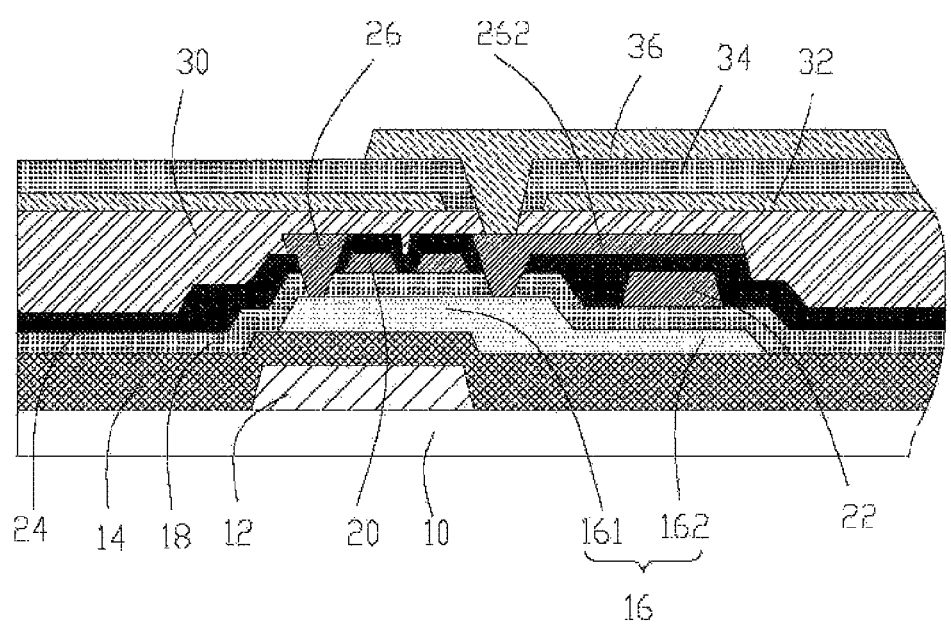
FIG. 1 is a cross-sectional view showing an LTPS array substrate according to a preferred embodiment of the present invention.

Referring to FIG. 1, FIG. 1 is a schematic view showing the structure of a low temperature poly-silicone (LTPS) array substrate according to a preferred embodiment of the present invention. The LTPS array substrate comprises a plurality of LTPS thin-film transistors and a bottom transparent conductive layer 32, a protective layer 34, and a top transparent conductive layer 36. The instant embodiment will be described by taking a single one of the LTPS thin-film transistors as an example.

Each of the LTPS thin-film transistors comprises a substrate 10, a patterned light shield layer 12, a buffering layer 14, a patterned poly-silicon layer 16, a gate insulation layer 18, a gate electrode line 20 and a common electrode line 22, an insulation layer 24, a drain electrode 26 and a source electrode, and a planarization layer 30. The bottom transparent conductive layer 32 is formed on the planarization layer 30. The patterned poly-silicon layer 16 comprises a first portion 161 and a second portion 162. The drain electrode 26 comprises an extension section 262 extending therefrom. The extension section 262 is opposite to the second portion 162. A specific description will be given as follow:

The substrate 10 is commonly a transparent glass sheet.

The substrate 10 receives the patterned light shield layer 12 to formed thereon, wherein patternization refers to application of exposure and etching operations to the material of the light shield layer coated on the entire substrate 10 to finally form the patterned light shield layer 12. The light shield layer 12 comprises a material that is molybdenum/alloy alloys, chromium metal, molybdenum metal, or other materials having the properties of light shielding and electrical conductivity.

The buffering layer 14 is formed on the substrate 10 and the patternized light shield layer 12.

The patternized poly-silicon layer 16 is formed on the buffering layer 14. Here, patternization refers to formation through application of exposure and etching operations to poly-silicon coated on the buffering layer 14. In the instant embodiment, the patternized poly-silicon layer 16 comprises the first portion 161 that has an orthogonal projection cast on the light shield layer 12 and the second portion 162 that extends away from the light shield layer 12. The second portion 162 is on the same plane as a portion of the buffering layer 14 having an orthogonal projection cast on the light shield layer 12.

The gate insulation layer 18 is formed on the patternized poly-silicon layer 16 and the buffering layer 14. The gate insulation layer 18 is made of one of silicon oxide (SiOx), silicon nitride (SiNx), and silicon oxynitride (SiNxOy).

A first metal layer (not shown) is formed on the gate insulation layer 18 and the first metal layer is patternized to form the gate electrode line 22 and the common electrode line 22. The common electrode line 22, the second portion 162 of the poly-silicon layer 16 that corresponds to the common electrode line 22, and the gate insulation layer 18 interposed between the common electrode line 22 and the second portion 162 of the poly-silicon layer 16 collectively constitute a first storage capacitor $C_1$. The common electrode line 22 is located exactly above the second portion 162.

The insulation layer 24 is formed on the gate insulation layer 18 and the gate electrode line 20 and the common electrode line 22. Etching is applied to form a first via (not shown) extending through the insulation layer 24 and the gate insulation layer 18 so that the first via exposes a portion of the patternized poly-silicon layer 16.

A second metal layer (not shown) is formed on the insulation layer 24 and the second metal layer is patternized to form the drain electrode 26 and the source electrode. The drain electrode 26 comprises the extension section 262 extending therefrom in such a way that the extension section 262 has an orthogonal projection cast on the common electrode line 22. The extension section 262 of the drain electrode 26 and the common electrode line 22 and the insulation layer 24 interposed between the extension section 262 and the common electrode line 22 collectively constitute a second storage capacitor $C_2$. The second storage capacitor $C_2$ is arranged in parallel with the first storage capacitor $C_1$. In the instant embodiment, the second metal layer is formed on the insulation layer 24 and is electrically connected through the first via to the patternized poly-silicon layer 16. In other words, the drain electrode 26 and source electrode are electrically connected, through the first via, to the patternized poly-silicon layer 16. The first metal layer and the second metal layer comprise materials that are electrically conductive materials, such as molybdenum/aluminum alloys and chromium metal.

The planarization layer 30 is formed on the insulation layer 24 and the patternized second metal layer. The planarization layer 30 comprises a material of an organic film. The planarization layer 30 is formed through masking operations.

In the instant embodiment, the LTPS array substrate further comprises a patternized bottom transparent conductive layer 32 formed on the planarization layer 30. The bottom transparent conductive layer 32 and the extension section 262 of the drain electrode 26 and the planarization layer 30 interposed between the extension section 262 and the bottom transparent conductive layer 32 collectively constitute a third storage capacitor $C_3$. The third storage capacitor $C_3$ is arranged in parallel with the second storage capacitor $C_2$ and the first storage capacitor $C_1$.

In the instant embodiment, the LTPS array substrate further comprises a protection layer 34 formed on the patternized bottom transparent conductive layer 32 and a top transparent conductive layer 36 formed on the protection layer 34. The top transparent conductive layer 36 and the bottom transparent conductive layer 32 and the protection layer 34 interposed between the top transparent conductive layer 36 and the bottom transparent conductive layer 32 collectively constitute a fourth storage capacitor $C_4$. The fourth storage capacitor $C_4$ is arranged in parallel with the third storage capacitor C3, the second storage capacitor $C_2$, and the first storage capacitor $C_1$. The top transparent conductive layer 36 and the bottom transparent conductive layer 32 are respectively a pixel electrode layer and a common electrode layer of the array substrate. The top transparent conductive layer 36 is formed on the protective layer 34 and is electrically connected, through a second via that extends through the bottom transparent conductive layer 32, the protective layer 34, and the planarization layer 30, to the drain electrode 26.

The present invention provides an LTPS array substrate that comprises a patternized poly-silicon layer 16 that comprises an additional second portion 162 and a drain electrode 26 that comprises an extension section 262 formed above the second portion 162 so that a common electrode line 22, the second portion 162 of the poly-silicon layer 16 that corresponds to the common electrode line 22, and a gate insulation layer 18 interposed between common electrode line 22 and the second portion 162 of the drain electrode 16 collectively form a first storage capacitor C1; and the extension portion 262 of the drain electrode 26 and the common electrode line 22 and an insulation layer 24 between the extension section 262 and the common electrode line 22 collectively form a second storage capacitor $C_2$, where the first storage capacitor $C_1$ is parallel connection with the second storage capacitor $C_2$. Further, the LTPS array substrate also comprises a fourth storage capacitor $C_4$ and a third storage capacitor $C_3$ that are in parallel connection with the second storage capacitor $C_2$ and the first storage capacitor $C_1$, whereby the storage capacitance is increased without reducing aperture ratio so as to suit the requirement of capacitance for electrical saturation of the array substrate.

Figure 2:
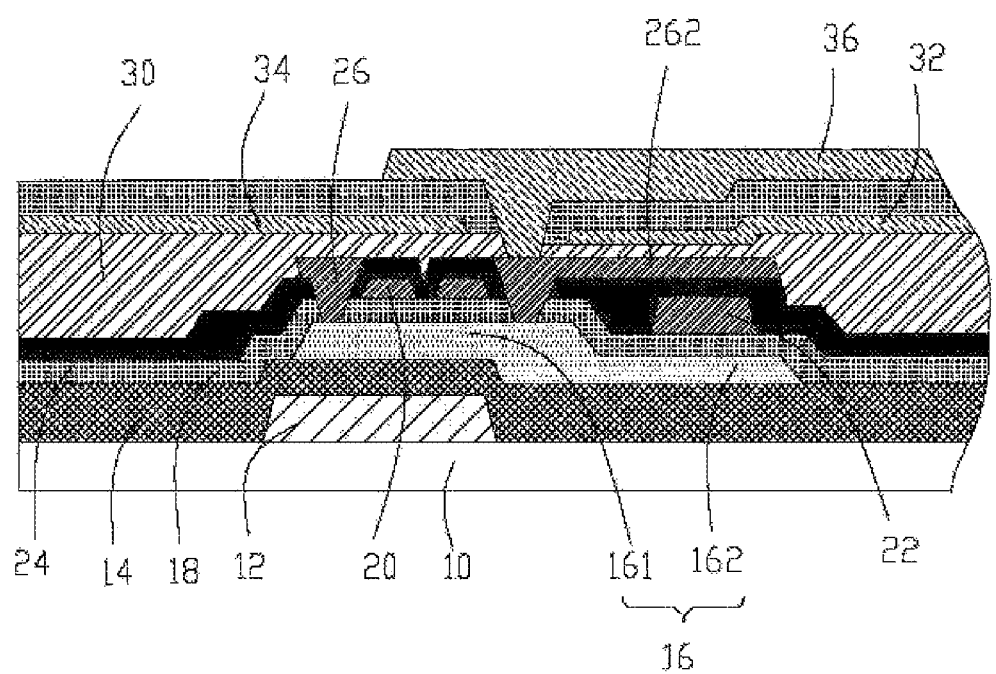
FIG. 2 is a cross-sectional view showing an LTPS array substrate according to another preferred embodiment of the present invention, the LTPS array substrate being different from FIG. 1 in the thickness of a portion of a planarization layer.

Referring to FIG. 2, in other embodiments of the present invention, the portion of the planarization layer 30 that is located above the extension section 262 of the drain electrode 26 has a thickness that is smaller than that of another portion of the planarization layer 30. This reduces the distance between the bottom transparent conductive layer 32 and the extension section 262 of the drain electrode 26 so as to increase the third storage capacitor $C_3$.

The above illustrates only a preferred embodiment according to the present invention and is not intended to limit the scope of right of the present invention. Those having ordinary skills of the art would appreciate that various equivalent modifications that achieve all or some of the operations of the above-described embodiment and fall within scope of the attached claims are considered within the scope covered by the present invention.

What is claimed is:

1. A low temperature poly-silicon (LTPS) array substrate, comprising a plurality of LTPS thin-film transistors, wherein each of the LTPS thin-film transistors comprises a substrate;
   a patternized light shield layer formed on the substrate;
   a buffering layer formed on the substrate and the patternized light shield layer;
   a patternized poly-silicon layer formed on the buffering layer, wherein the patternized poly-silicon layer comprises a first portion having an orthogonal projection cast on the light shield layer and a second portion extending in a direction away from the light shield layer;
   a gate insulation layer formed on the patternized poly-silicon layer and the buffering layer;
   a first metal layer formed on the gate insulation layer, the first metal layer being patternized to form a gate electrode line and a common electrode line, the common electrode line, the second portion of the poly-silicon layer that corresponds to the common electrode line, and the gate insulation layer interposed between the common electrode line and the second portion collectively forming a first storage capacitor;
   an insulation layer formed on the gate insulation layer and the gate electrode line and the common electrode line;
   a second metal layer formed on the insulation layer, the second metal layer being patternized to form a drain electrode and a source electrode, the drain electrode comprising an extension section extending therefrom, the extension section having an orthogonal projection cast on the common electrode line, the extension section of the drain electrode and the common electrode line and the insulation layer between the extension section and the common electrode line collectively forming a second storage capacitor, the second storage capacitor being arranged in parallel with the first storage capacitor; and
   a planarization layer formed on the insulation layer and the patternized second metal layer;
   wherein each of the LTPS thin-film transistors comprises multiple storage capacitors that include at least the first storage capacitor and the second storage capacitor, wherein the first storage capacitor that is formed of the gate insulation layer interposed between the common electrode line and the second portion of the poly-silicon layer and the second storage capacitor that is formed of the insulation layer interposed between the common electrode line and the extension section of the drain electrode are respectively located on opposite sides of the common electrode line;
   wherein the LTPS array substrate further comprises a patternized bottom transparent conductive layer formed on the planarization layer, the bottom transparent conductive layer and the extension section of the drain electrode and the planarization layer between the extension section and the bottom transparent conductive layer collectively forming a third storage capacitor, the third storage capacitor being arranged in parallel with the second storage capacitor and the first storage capacitor, wherein the third storage capacitor that is formed of the planarization layer interposed between the bottom transparent conductive layer and the extension section of the drain electrode and the second storage capacitor that is formed of the insulation layer interposed between the common electrode line and the extension section of the drain electrode are respectively located on opposite sides of the extension section of the drain electrode;
   wherein the LTPS array substrate further comprises a protection layer formed on the patternized bottom transparent conductive layer and a top transparent conductive layer formed on the protection layer, the top transparent conductive layer and the bottom transparent conductive layer and the protection layer between the top transparent conductive layer and the bottom transparent conductive layer collectively forming a fourth storage capacitor, the fourth storage capacitor being arranged in parallel with the third storage capacitor, the second storage capacitor, and the first storage capacitor, wherein the fourth storage capacitor that is formed of the protection layer interposed between the bottom transparent conductive layer and the top transparent conductive layer and the third storage capacitor that is formed of the planarization layer interposed between the bottom transparent conductive layer and the extension section of the drain electrode are respectively located on opposite sides of the bottom transparent conductive layer wherein the first, second, third, and fourth storages are sequentially stacked in a vertical direction, where the common electrode line is common to the first and second storage capacitors; the extension section of the drain electrode is common to the second and third storage capacitors; and the bottom transparent conductive layer is common to the third and fourth storage capacitors such that the first, second, third, and fourth storage capacitors are connected parallel to each other.

2. The LTPS array substrate as claimed in claim 1, wherein the second metal layer is formed on the insulation layer and is electrically connected through a via to the poly-silicon layer.

3. The LTPS array substrate as claimed in claim 1, wherein the top transparent conductive layer is formed on the protective layer and is electrically connected through a via to the drain electrode.

4. The LTPS array substrate as claimed in claim 1, wherein the planarization layer has a portion that is located above the extension section of the drain electrode and has a thickness that is smaller than that of another portion of the planarization layer.

5. The LTPS array substrate as claimed in claim 1, wherein the gate insulation layer is made of one of silicon oxide, silicon nitride, and silicon oxynitride.

6. The LTPS array substrate as claimed in claim 1, wherein the first metal layer and the second metal layer comprise materials that are electrically conductive materials of molybdenum/aluminum alloys and chromium metal.

7. The LTPS array substrate as claimed in claim 1, wherein the planarization layer comprises a material of an organic film.

8. The LTPS array substrate as claimed in claim 1, wherein the planarization layer is formed through masking operations.

* * * * *